(12) United States Patent
Zhang et al.

(10) Patent No.: US 12,137,315 B2
(45) Date of Patent: Nov. 5, 2024

(54) EARPHONE AND METHOD FOR IDENTIFYING WHETHER AN EARPHONE IS BEING INSERTED INTO AN EAR OF A USER

(71) Applicant: Robert Bosch GmbH, Stuttgart (DE)

(72) Inventors: Rui Zhang, Wannweil (DE); Juergen Gut, Tuebingen (DE); Sergej Scheiermann, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 102 days.

(21) Appl. No.: 17/998,133

(22) PCT Filed: Jul. 22, 2021

(86) PCT No.: PCT/EP2021/070478
§ 371 (c)(1),
(2) Date: Nov. 7, 2022

(87) PCT Pub. No.: WO2022/053212
PCT Pub. Date: Mar. 17, 2022

(65) Prior Publication Data
US 2023/0232147 A1    Jul. 20, 2023

(30) Foreign Application Priority Data
Sep. 9, 2020   (DE) ...................... 10 2020 211 299.1

(51) Int. Cl.
*H04R 3/00*   (2006.01)
*G01P 15/18*   (2013.01)
(Continued)

(52) U.S. Cl.
CPC ............ *H04R 1/1041* (2013.01); *G01P 15/18* (2013.01); *G06F 3/011* (2013.01)

(58) Field of Classification Search
CPC ........ H04R 1/1041; G01P 15/18; G06F 3/011
See application file for complete search history.

(56) References Cited

U.S. PATENT DOCUMENTS 10,257,602 B2 *  4/2019  Kofman ............... H04R 1/1041
10,306,350 B1    5/2019  Lin et al.
(Continued)

FOREIGN PATENT DOCUMENTS

AU    2017216591 A1    3/2018
CN    108810788 A      11/2018
(Continued)

OTHER PUBLICATIONS

International Search Report for PCT/EP2021/070478, Issued Nov. 8, 2021.

*Primary Examiner* — Simon King
(74) *Attorney, Agent, or Firm* — NORTON ROSE FULBRIGHT US LLP; Gerard A. Messina

(57) ABSTRACT

An earphone including a proximity sensor, an acceleration sensor, and a signal analysis device. The signal analysis device identifies an approaching movement of the earphone to an object using the proximity sensor signal. The signal analysis device ascertains whether the approaching movement is a movement of the earphone to an ear of the user. By filtering the acceleration sensor signal, the signal analysis device generates a high-pass filtered acceleration signal and a low-pass filtered acceleration signal. The signal analysis device determines an end time of the approaching movement based on a stabilization of the acceleration, using the low-pass filtered acceleration signal. The signal analysis device confirms that the approaching movement is a movement of the earphone to an ear of the user based on changes in the high-pass filtered acceleration signal after the ascertained end time of the approaching movement.

10 Claims, 4 Drawing Sheets

(51) Int. Cl.
   *G06F 3/01*    (2006.01)
   *H04R 1/10*    (2006.01)

(56) References Cited

U.S. PATENT DOCUMENTS

| | | |
|---|---|---|
| 10,734,965 B1 | 8/2020 | McPherson et al. |
| 10,771,888 B1* | 9/2020 | Oishi ................ H04R 3/04 |
| 2009/0296951 A1 | 12/2009 | De Haan |
| 2010/0130132 A1 | 5/2010 | Lee et al. |
| 2011/0286615 A1 | 11/2011 | Olodort et al. |
| 2015/0078573 A1 | 3/2015 | Nicholson |
| 2015/0281421 A1 | 10/2015 | Yang |
| 2015/0281826 A1 | 10/2015 | Huang |
| 2015/0382098 A1 | 12/2015 | Aita |
| 2016/0050474 A1 | 2/2016 | Rye et al. |
| 2016/0057555 A1 | 2/2016 | Schuster et al. |
| 2016/0198251 A1 | 7/2016 | Pan |
| 2016/0205475 A1 | 7/2016 | Shanmugam et al. |
| 2017/0244821 A1 | 8/2017 | Ishida et al. |
| 2018/0070166 A1* | 3/2018 | Howell ............... H04R 1/1016 |
| 2018/0324518 A1* | 11/2018 | Dusan ................... G06F 3/167 |
| 2019/0246196 A1 | 8/2019 | Han et al. |
| 2019/0313178 A1* | 10/2019 | Mutlu ................ H04R 1/1016 |

FOREIGN PATENT DOCUMENTS

| | | |
|---|---|---|
| CN | 208971758 U | 6/2019 |
| CN | 110012376 A | 7/2019 |
| CN | 111314813 A | 6/2020 |
| CN | 111372157 A | 7/2020 |
| EP | 3561646 A1 | 10/2019 |
| JP | 2014143451 A | 8/2014 |
| WO | 2016153723 A1 | 9/2016 |
| WO | 2019039894 A1 | 2/2019 |

* cited by examiner

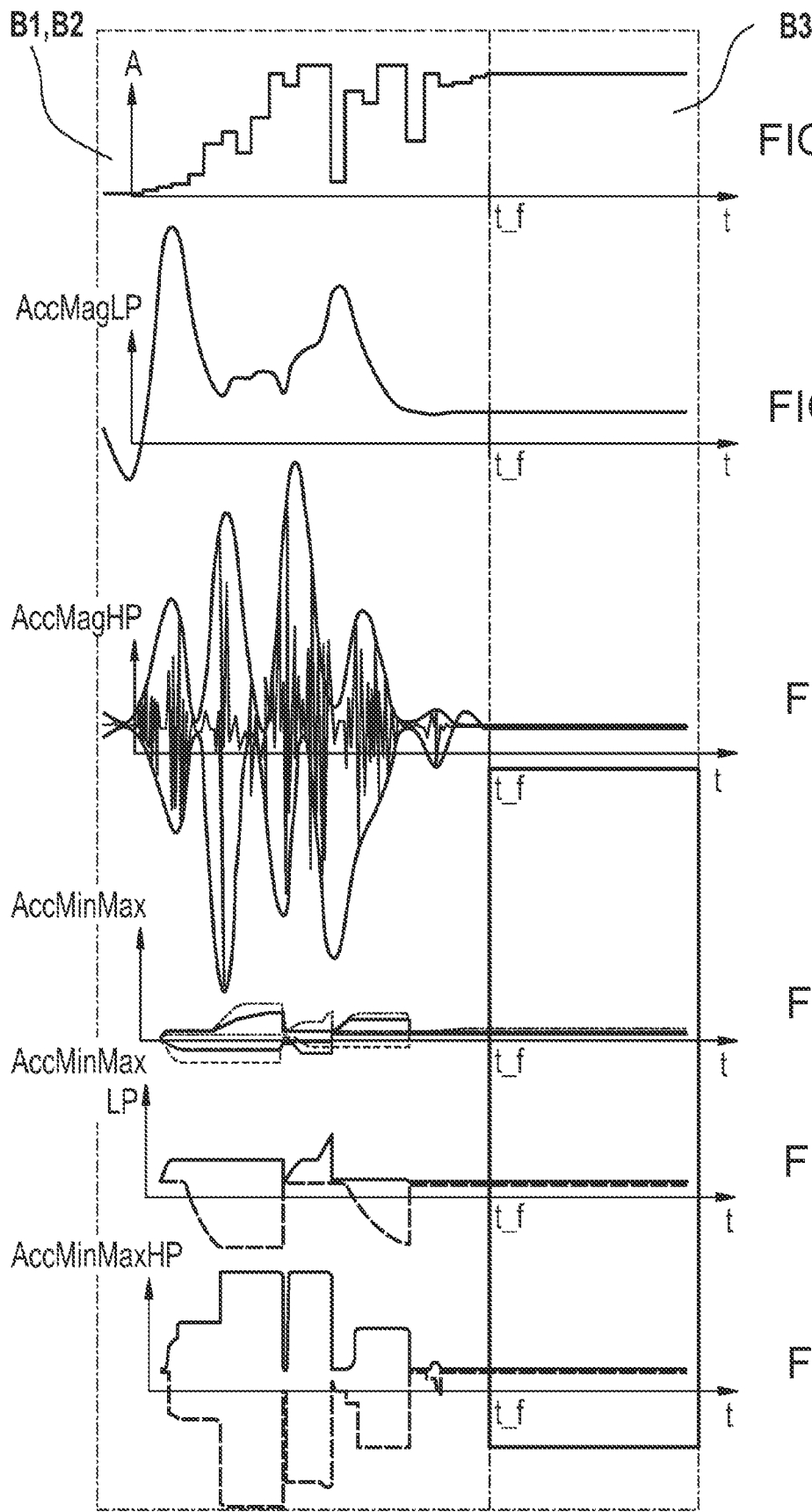

EARPHONE AND METHOD FOR IDENTIFYING WHETHER AN EARPHONE IS BEING INSERTED INTO AN EAR OF A USER

FIELD

The present invention relates to an earphone and a method for identifying whether an earphone is being inserted into an ear of a user.

BACKGROUND INFORMATION

To improve the user experience, more and more sensors are being built into hearables, i.e., earphones having additional functionality. One important functionality is the identification of whether or not the earphone is being worn. This is advantageous, for instance, to switch certain components of the earphone on or off in order to save energy, or to perform a mono/stereo adjustment in order to provide a better music experience.

Identification of whether an earphone is in the user's ear may be carried out on the basis of data from a proximity sensor, as is described in PCT Patent Application No. WO 1 903 9894 A1, U.S. Patent Application Publication Nos. US 2017/244821 A, US 2016/198251 A, US 2015/382098 A, US 2015/281826 A, U.S. Pat. No. 10,306,350 B, and China Patent Application No. CN 110012376 A.

Proximity sensors here may ascertain the approach of the earphone to the user's ear using distance measurements or by measuring light intensities. Identification based on proximity sensors allows many true-positive results, many true-negative results, and few false-negative results. However, proximity sensors also generate many false-positive results, i.e. they exhibit a high error rate with regard to the in-ear status. For instance, a low light intensity or a close proximity may lead to the conclusion that the earphone is in the ear. This is problematic, since the earphone may also be in a pants pocket, a bag or a hand.

Other sensors may therefore also be used, in particular biosensors, contact sensors or additional proximity sensors, as described in U.S. Patent Application Publication Nos. US 2016/205475 A, US 2016/050474 A, US 2015/281421 A, US 2015/078573 A, US 2011/286615 A, and China Patent Application Nos. CN 208971758 U, and CN 108810788 A. However, the power consumption of these types of sensors is relatively high. As a result, the operating time of the earphone is reduced.

SUMMARY

The present invention provides an earphone and a method for identifying whether an earphone is being inserted into an ear of a user.

Preferred embodiments of the present invention are disclosed herein.

According to a first aspect, the invention accordingly relates to an earphone including a proximity sensor, an acceleration sensor, and a signal analysis device. According to an example embodiment of the present invention, the proximity sensor is designed to generate a proximity sensor signal. The acceleration sensor is designed to generate an acceleration sensor signal. The signal analysis device is designed to identify an approaching movement of the earphone to an object using the proximity sensor signal. Furthermore, the signal analysis device ascertains whether the approaching movement is a movement of the earphone to an ear of the user, with fluctuations in the time profile of the proximity sensor signal being analyzed and taken into consideration. By filtering the acceleration sensor signal, the signal analysis device generates a high-pass filtered acceleration signal and a low-pass filtered acceleration signal. Furthermore, the signal analysis device uses the low-pass filtered acceleration signal to ascertain an end time of the approaching movement, based on a stabilization of the acceleration. The signal analysis device confirms that the approaching movement is a movement of the earphone to an ear of the user based on changes in the high-pass filtered acceleration signal after the ascertained end time of the approaching movement.

According to a second aspect, the present invention accordingly relates to a method for identifying whether an earphone is being inserted into an ear of a user. According to an example embodiment of the present invention, an approaching movement of the earphone to an object is identified using a proximity sensor signal of a proximity sensor of the earphone. It is ascertained whether the approaching movement is a movement of the earphone to an ear of the user, with fluctuations in the time profile of the proximity sensor signal being analyzed and taken into consideration. An acceleration sensor signal of an acceleration sensor of the earphone is filtered in order to generate a high-pass filtered acceleration signal and a low-pass filtered acceleration signal. Using the low-pass filtered acceleration signal, an end time of the approaching movement is ascertained based on a stabilization of the acceleration. It is confirmed that the approaching movement is a movement of the earphone to an ear of the user based on changes in the high-pass filtered acceleration signal after the ascertained end time of the approaching movement.

According to an example embodiment of the present invention, identification of whether the earphone is being inserted into an ear of the user takes place using both a proximity sensor and an acceleration sensor. By combining these sensors, it is possible in particular to reduce false-positive results. Thus, for instance, it is easier to identify and rule out an operation in which the user places the earphone into a pocket or bag. Such an operation is then no longer incorrectly identified as insertion of the earphone into the user's ear. This is achieved by initially identifying a possible approach of the earphone to the user's ear based on the proximity sensor. This hypothesis is confirmed or rejected based on the sensor data of the acceleration sensor. While the high proportion of true-positive results, the high proportion of true-negative results and the low proportion of false-negative results are maintained, it is therefore additionally possible for the proportion of false-positive results to be significantly reduced.

According to the present invention, an "end time" of the approaching movement may correspond to a time at which, based on the proximity sensor signal, it is identified that the earphone is in the ear, and/or a low-pass filtered contribution of the acceleration signal starts to stabilize.

The use of acceleration sensors involves significantly lower power consumption compared with other sensors, such as contact sensors, biosensors or the like. As a result, the operating life of the earphone is significantly increased.

Furthermore, a current movement or activity of the user may also be monitored on the basis of the acceleration sensor data. This makes it possible to determine, for instance, whether the current movement or activity has a high or low probability of being caused by a movement of the user's head.

According to an example embodiment of the present invention, it is furthermore advantageous that modern earphones are typically already equipped with (triaxial) acceleration sensors in order to provide, for instance, activity recognition, a step count function, posture monitoring or the like. As a result, no additional functions are needed in order to provide the functionality with regard to assessing whether the earphone is being guided to the user's ear. Furthermore, it also means that no additional space is taken up in the earphone.

According to one specific example embodiment of the earphone of the present invention, the signal analysis device is designed to ascertain and take into consideration a monotonicity of the time profile of the proximity sensor signal in order to analyze the fluctuations in the profile of the proximity sensor signal of the proximity sensor. In the case of a movement of the earphone to the user's ear, the proximity sensor signal typically has a monotonic, smooth profile. In the case of a movement of the earphone into the user's pocket or bag, relatively large fluctuations in the proximity sensor signal occur owing to the movement of the earphone in the pocket or bag. For example, a measure of the monotonicity of the time profile of the proximity sensor signal may be calculated, for instance a probability. If this measure exceeds a predefined threshold value, and therefore the profile of the proximity sensor signal is sufficiently monotonic, a movement of the earphone to an ear of the user may therefore be ascertained.

According to one specific example embodiment of the earphone, the signal analysis device is designed to confirm that the approaching movement is a movement of the earphone to an ear of the user if a measure of the changes in the high-pass filtered acceleration signal after the ascertained end time of the approaching movement exceeds a first predefined threshold value. The high-pass filtered acceleration signal corresponds to small accelerations of the earphone which are generated after the earphone has been inserted into the user's ear by the earphone still moving slightly in the user's ear until the final position is assumed. This is caused by, for instance, the flexible material of the earphone, which still leads to a slight change in the position of the earphone even after the earphone has been inserted into the user's ear. Vibrations decrease or the position or location of the earphone in the ear still changes slightly. Stabilization phases of this type may therefore be identified on the basis of the acceleration signal.

According to one specific example embodiment of the earphone, the signal analysis device is designed to recognize that the approaching movement is not a movement of the earphone to an ear of the user if the measure of the changes in the high-pass filtered acceleration signal after the ascertained end time of the approaching movement is below a second predefined threshold value. Thus, for instance, operations in which the earphone is placed into a pocket or bag of the user may be ruled out, there being no adjustment operations taking place as described above.

According to one specific example embodiment of the earphone, the signal analysis device is designed to ascertain, based on the proximity sensor signal, whether the earphone is being removed from the user's ear again. For instance, a distance may be ascertained, and if the ascertained distance exceeds a predefined threshold value, it is identified that the earphone is being removed from the user's ear.

According to one specific example embodiment of the earphone, the signal analysis device is designed to identify an absence of movement based on the acceleration sensor signal, and to set the earphone to an out-of-ear operating mode when this is identified. In situations in which the earphone does not move, for instance because it has been deposited on a solid substrate, the earphone is thus automatically set to an out-of-ear operating mode. To determine this, it may be identified whether higher orders of the derivatives of the acceleration are equal to zero.

According to one specific example embodiment of the earphone, the signal analysis device is designed to identify, based on the acceleration sensor signal, a movement of the earphone which, because of its intensity, cannot be generated by head movements, and to set the earphone to an out-of-ear operating mode when this is identified.

According to one specific embodiment of the earphone, as soon as it is identified that the earphone is in the user's ear, and as soon as a movement of the user is identified (for instance running or a periodic movement), the determination of whether the earphone is still in the user's ear may take place exclusively on the basis of the proximity sensor signal.

According to one specific embodiment of the earphone, the acceleration sensor is a triaxial acceleration sensor.

According to one specific embodiment of the earphone, the signal analysis device is designed to calculate maxima and minima of accelerations along the three axes and to take them into consideration when confirming that the approaching movement is a movement of the earphone to an ear of the user.

BRIEF DESCRIPTION OF DRAWINGS

FIG. 4A shows a profile of a sensor signal of a proximity sensor during a movement of the earphone into a pocket or bag of the user, according to an example embodiment of the present invention.

FIG. 4B shows a profile of a low-pass filtered contribution of the acceleration signal during a movement of the earphone into a pocket or bag of the user, according to an example embodiment of the present invention.

FIG. 4C shows a profile of a high-pass filtered contribution of the acceleration signal of a proximity sensor during a movement of the earphone into a pocket or bag of the user, according to an example embodiment of the present invention.

FIG. 4D shows a profile of a minimum and a maximum value of an acceleration signal of a triaxial acceleration sensor during a movement of the earphone into a pocket or bag of the user, according to an example embodiment of the present invention.

FIG. 4E shows a profile of a minimum and a maximum value of a low-pass filtered contribution of the acceleration signal during a movement of the earphone into a pocket or bag of the user, according to an example embodiment of the present invention.

FIG. 4F shows a profile of a minimum and a maximum value of a high-pass filtered contribution of the acceleration signal during a movement of the earphone into a pocket or bag of the user, according to an example embodiment of the present invention.

The numbering of method steps serves as an aid to clarity and is not in general intended to imply any specific chronological order. In particular, a plurality of method steps may also be carried out simultaneously.

DETAILED DESCRIPTION OF EXAMPLE EMBODIMENT

Figure 1:
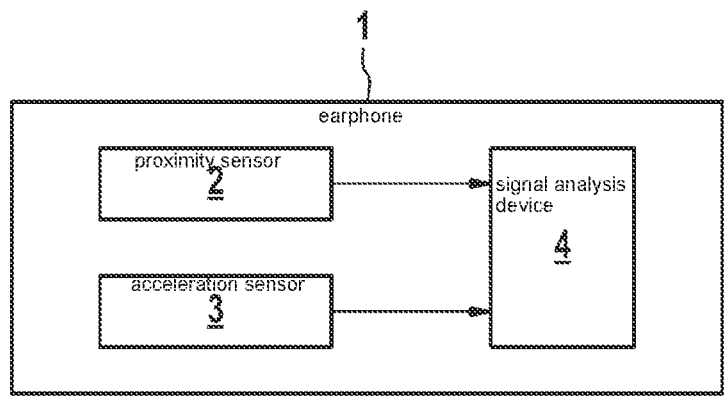
FIG. 1 shows a schematic block diagram of an earphone according to one specific embodiment of the present invention.

FIG. 1 is a schematic block diagram of an earphone 1 according to one specific embodiment of the invention. Earphone 1 comprises a proximity sensor 2, which generates a proximity sensor signal, for instance on the basis of a velocity measurement or a brightness measurement, corresponding to a distance of earphone 1 from the object or at least correlating to the distance of earphone 1 from the object.

The earphone 1 further comprises an acceleration sensor 3, which may in particular be a triaxial acceleration sensor. Acceleration sensor 3 generates an acceleration sensor signal, which may comprise, for instance, accelerations of earphone 1 along each of the three axes.

Finally, earphone 1 comprises a signal analysis device 4, which is coupled to proximity sensor 2 and acceleration sensor 3. Signal analysis device 4 comprises a computing device, for instance a microprocessor, an integrated circuit or the like. Using the proximity sensor signal, signal analysis device 4 identifies an approaching movement of the earphone to an object if the distance of earphone 1 is reduced substantially to zero.

Signal analysis device 4 further ascertains whether the approaching movement is a movement of earphone 1 to an ear of the user, with fluctuations in the time profile of the proximity sensor signal being analyzed and taken into consideration. For this purpose, for instance, a monotonicity in the time profile of the proximity sensor signal may be ascertained. If there is sufficient monotonicity, signal analysis device 4 hypothesizes the existence of a movement of the earphone to the user's ear. This hypothesis is confirmed or rejected on the basis of the acceleration signal of acceleration sensor 3.

By filtering the acceleration sensor signal, signal analysis device 4 generates a high-pass filtered acceleration signal and a low-pass filtered acceleration signal. The low-pass filtered acceleration signal corresponds to a linear acceleration of earphone 1.

Furthermore, signal analysis device 4 uses the low-pass filtered acceleration signal to ascertain an end time of the approaching movement, based on a stabilization of the acceleration. For instance, the end time is identified if the fluctuations of the low-pass filtered acceleration signal are below a predefined threshold value. The low-pass filtered acceleration signal substantially only includes the proportion of the acceleration which is due to gravity.

Signal analysis device 4 confirms that the approaching movement is a movement of earphone 1 to an ear of the user if a measure of the changes in the high-pass filtered acceleration signal after the ascertained end time of the approaching movement exceeds a first predefined threshold value. If, on the other hand, the measure of the changes in the high-pass filtered acceleration signal is below a second predefined threshold value, which is less than the first predefined threshold value or equal to the first predefined threshold value, signal analysis device 4 rejects the hypothesis that the approaching movement is a movement of earphone 1 to an ear of the user.

Figures 2A, 2B:
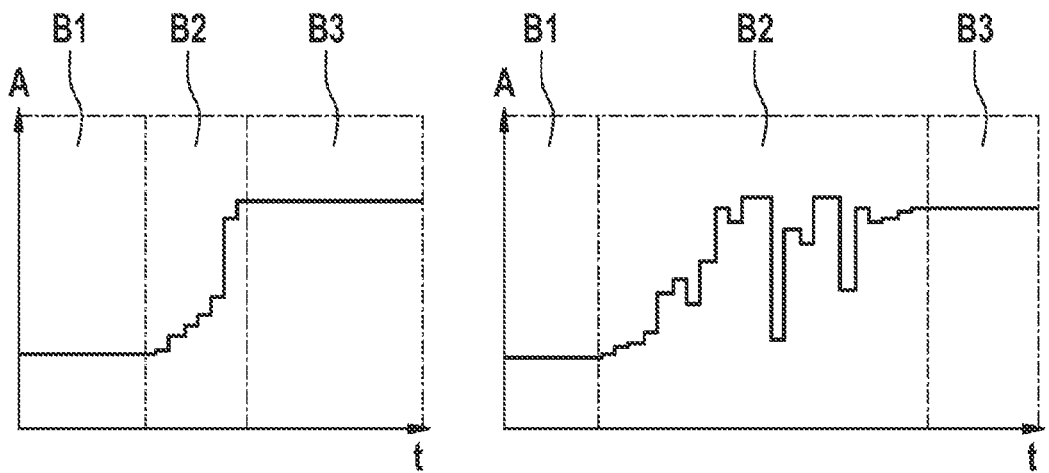
FIG. 2A shows a profile of a proximity sensor signal of a proximity sensor during a movement of the earphone to the user's ear.
FIG. 2B shows a profile of a proximity sensor signal of a proximity sensor during a movement of the earphone into a pocket or bag of the user.

FIG. 2A shows a profile of a proximity sensor signal A of proximity sensor 2 during a movement of earphone 1 to the user's ear. In a first time period B1, earphone 1 is out of the user's ear and is not moved. In a second time period B2, earphone 1 is guided to the user's ear, the time profile of the proximity sensor signal changing monotonically, i.e. rising continuously. In a third time period B3, the earphone is in the user's ear.

FIG. 2B shows a profile of a proximity sensor signal A of proximity sensor 2 during a movement of earphone 1 into a pocket or bag of the user. In the second time period B2 here, significantly greater fluctuations occur, i.e. the time profile of proximity sensor signal A is no longer as monotonic as in FIG. 2A.

Figure 3A:
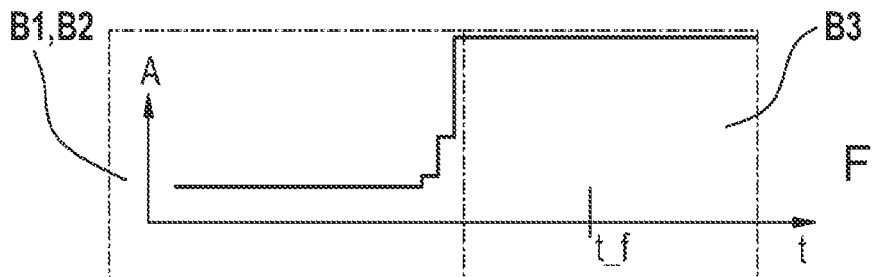
FIG. 3A shows a profile of a proximity sensor signal of a proximity sensor during a movement of the earphone to the user's ear.

FIG. 3A shows a profile of a proximity sensor signal A of proximity sensor 2 during a movement of earphone 1 to the user's ear. The profile corresponds substantially to the profile shown in FIG. 2A.

Figure 3B:
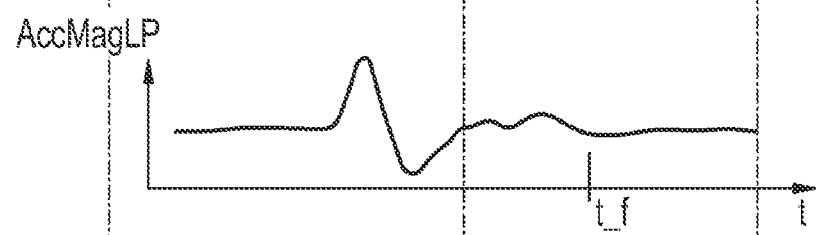
FIG. 3B shows a profile of a low-pass filtered contribution of the acceleration signal during a movement of the earphone to the user's ear, according to an example embodiment of the present invention.

FIG. 3B shows a profile of a contribution of a low-pass filtered acceleration signal AccMagLP during a movement of earphone 1 to the user's ear, i.e., a low-pass filtered acceleration magnitude which combines the contributions of all three axes. An end time t_f of the approaching movement corresponds to a time at which the low-pass filtered acceleration signal stabilizes, i.e. the fluctuations are less than a predefined threshold value.

Figure 3C:
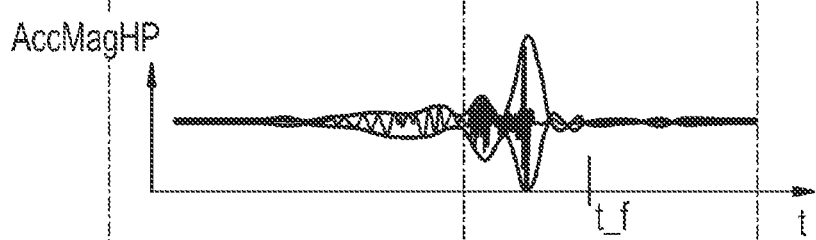
FIG. 3C shows a profile of a high-pass filtered contribution of the acceleration signal of a proximity sensor during a movement of the earphone to the user's ear, according to an example embodiment of the present invention.

FIG. 3C shows a profile of a high-pass filtered contribution of an acceleration signal AccMagHP of a proximity sensor during a movement of the earphone to the user's ear, i.e. a high-pass filtered acceleration magnitude which combines the contributions of all three axes. Fluctuations in the high-pass filtered acceleration signal visibly occur in the third time period B3, originating from adjustment movements of the earphone in the user's ear.

Figure 3D:
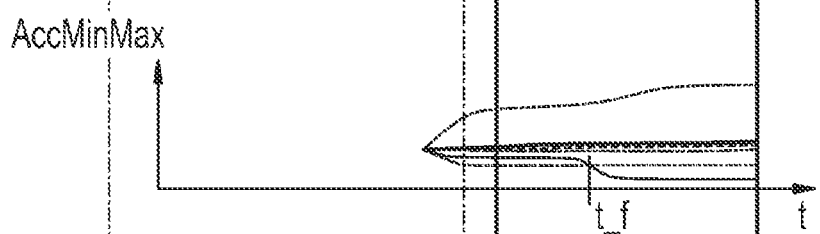
FIG. 3D shows a profile of a minimum and a maximum value of an acceleration signal of a triaxial acceleration sensor during a movement of the earphone to the user's ear, according to an example embodiment of the present invention.

FIG. 3D shows a profile of a minimum and a maximum value of an acceleration signal AccMinMax for measurement signals relating to each axis of a triaxial acceleration sensor 3 during a movement of earphone 1 to the user's ear. It is possible to identify the time in the third time period B3 at which the minimum and maximum values of the acceleration signal are reached.

Figure 3E:
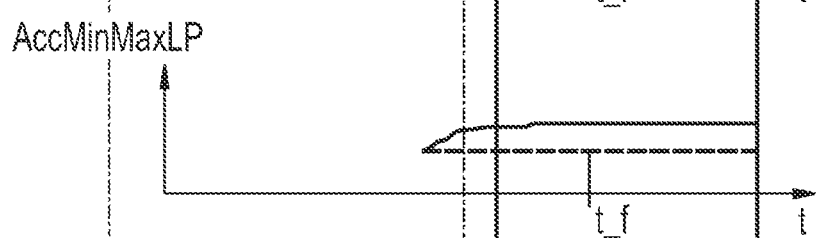
FIG. 3E shows a profile of a minimum and a maximum value of a low-pass filtered contribution of the acceleration signal during a movement of the earphone to the user's ear, according to an example embodiment of the present invention.

FIG. 3E shows a profile of a minimum and a maximum value of a low-pass filtered acceleration signal AccMinMaxLP during a movement of earphone 1 to the user's ear, i.e. of a low-pass filtered acceleration magnitude which combines the contributions of all three axes.

Figure 3F:
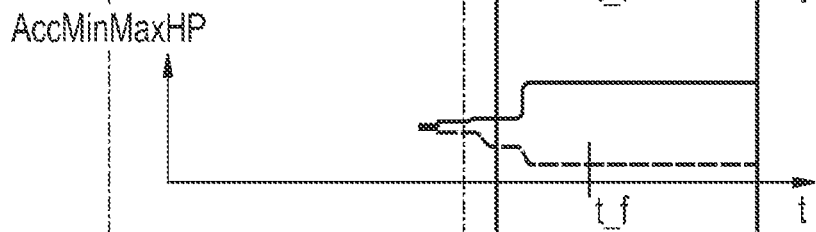
FIG. 3F shows a profile of a minimum and a maximum value of a high-pass filtered contribution of the acceleration signal during a movement of the earphone to the user's ear, according to an example embodiment of the present invention.

FIG. 3F shows a profile of a minimum and a maximum value of a high-pass filtered acceleration signal AccMinMaxHP during a movement of earphone 1 to the user's ear, i.e. of a high-pass filtered acceleration magnitude which combines the contributions of all three axes. When the low-pass filtered contribution of the acceleration signal stabilizes, i.e. no changes occur in the minimum and maximum values, the high-pass filtered contribution of the acceleration signal still varies markedly, so that a large change in the minimum and maximum values results.

FIG. 4A shows a profile of a sensor signal of a proximity sensor during a movement of the earphone into a pocket or bag of the user, which corresponds substantially to the profile shown in FIG. 2B.

FIG. 4B shows a profile of a low-pass filtered acceleration signal during a movement of the earphone into a pocket or bag of the user, i.e. of a low-pass filtered acceleration magnitude which combines the contributions of all three axes.

FIG. 4C shows a profile of a high-pass filtered acceleration signal of a proximity sensor during a movement of the earphone into a pocket or bag of the user, i.e. of a high-pass filtered acceleration magnitude which combines the contributions of all three axes. In contrast to FIG. 3C, the fluctuations in the profile of the high-pass filtered acceleration signal now take place substantially exclusively in the first and second time periods B1, B2. The fluctuations take place before the end time t_f.

FIG. 4D shows a profile of a minimum and a maximum value of an acceleration signal of a triaxial acceleration sensor during a movement of earphone 1 into a pocket or bag of the user. In contrast to FIG. 3D, the minimum and maximum values scarcely change after the end time t_f.

FIG. 4E shows a profile of a minimum and a maximum value of a low-pass filtered acceleration signal during a movement of earphone 1 into a pocket or bag of the user, i.e. of a low-pass filtered acceleration magnitude which combines the contributions of all three axes. In contrast to FIG. 3E, the absolute values in the first and second time periods B1, B2 are greater than in the third time period B3.

FIG. 4F shows a profile of a minimum and a maximum value of a high-pass filtered acceleration signal during a movement of the earphone into a pocket or bag of the user, i.e. of a high-pass filtered acceleration magnitude which combines the contributions of all three axes. The minimum and maximum values of the high-pass filtered acceleration signal no longer change after the end time t_f, i.e. once the low-pass filtered contribution of the acceleration signal has stabilized.

All the signal profiles shown in FIGS. 3A to 3F, and in 4A to 4F, may be analyzed mathematically, for instance by calculating a probability that the movement is a movement to the user's ear.

The low-pass filtered contribution of the acceleration value corresponds to the linear acceleration. The high-pass filtered contribution of the acceleration value corresponds to the rotation and positional change of the earphone. The minimum and maximum values of the low-pass filtered acceleration value indicate when a linear acceleration occurs or ends, and how great the change is. The minimum and maximum values of the high-pass filtered acceleration value and of the three axes indicate when an acceleration due to rotation or positional change occurs or ends, and how great the change is.

A linear acceleration corresponds to an acceleration due to movement and is reflected mainly by the low-pass filtered acceleration magnitude. The linear acceleration corresponds to the low-pass filtered acceleration magnitude minus the contribution of gravity. If the value of the linear acceleration is close to zero, the end time is identified. After the end time, no linear acceleration occurs in the case of either a movement to the user's ear or a movement into a pocket or bag of the user. Even in the case of a linear acceleration of zero, the acceleration itself may still change. In this case $$\sqrt{(acc_x^2 + acc_y^2 + acc_z^2)}\sqrt{(acc_x^2+acc_y^2+acc_z^2)}$$

is equal to the contribution of gravity, with $acc_{x,y,z}^2$ being the contributions in the x, y, and z directions. This relationship also applies when the earphone rotates, so that no linear acceleration occurs although there are changes in $acc_{x,y,z}^{acc_{x,y,z}}$. Movements of this type are identifiable in the high-pass filtered contribution of the acceleration magnitude.

It is identified whether there is any change to the high-pass filtered contribution of the acceleration magnitude, or to the maximum and minimum values of the acceleration, once the low-pass filtered magnitude corresponds approximately to the contribution of gravity and almost no linear acceleration occurs, i.e. after the end time. If this is the case, the movement is a movement to the ear; otherwise it is a movement into a pocket or bag, for instance.

Figure 5:
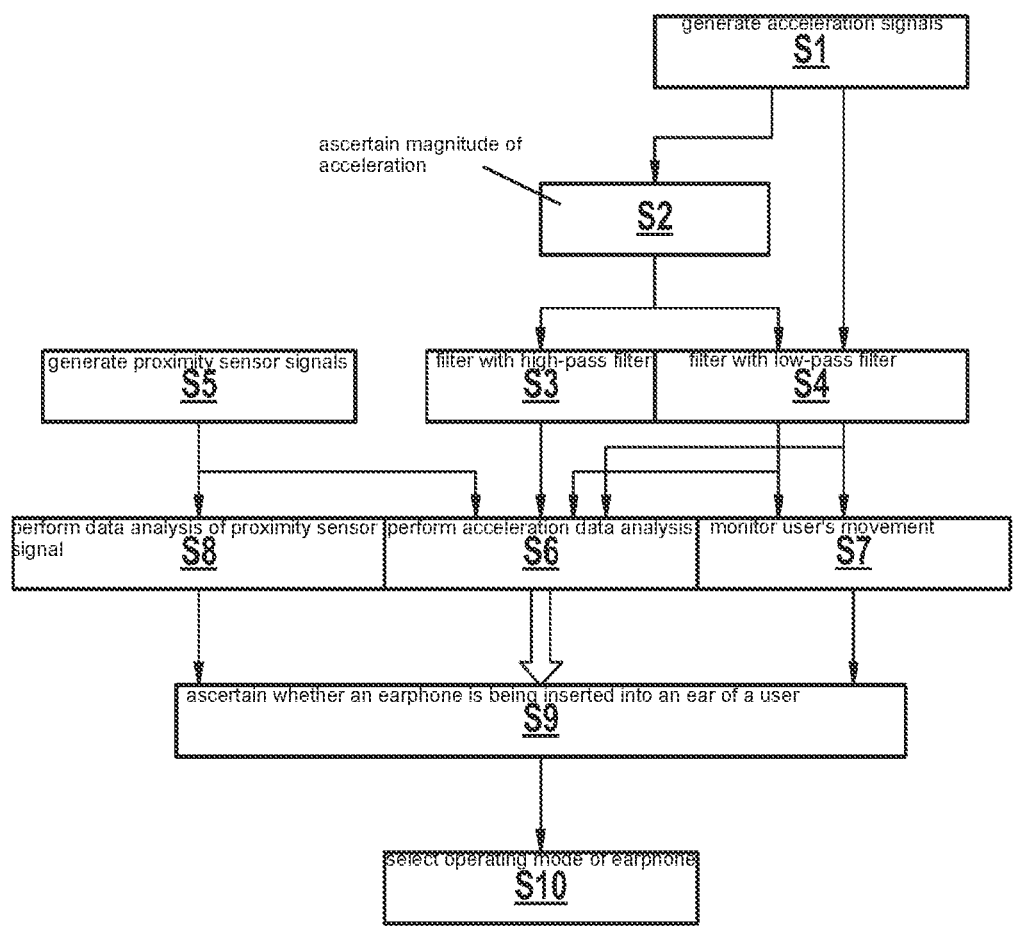
FIG. 5 shows a flow chart of a method for identifying whether an earphone is being inserted into an ear of a user according to one specific embodiment of the present invention.

FIG. 5 is a flow chart of a method for identifying whether an earphone 1 is being inserted into an ear of a user. An earphone 1 as described above may be used for the method.

In a first method step S1, an acceleration sensor 3 generates acceleration sensor signals.

In a method step S2, the magnitude of the acceleration is ascertained on the basis of the acceleration sensor signals using a triaxial acceleration sensor 3 for each of the three axes.

In method step S3, the acceleration sensor signal is filtered using a high-pass filter in order to generate a high-pass filtered acceleration signal.

In method step S4, the acceleration sensor signal is filtered using a low-pass filter in order to generate a low-pass filtered acceleration signal.

In a method step S5, proximity sensor signals are generated by a proximity sensor 2.

In a method step S6, an acceleration data analysis is performed using the proximity sensor signals, the high-pass filtered acceleration signal, and the low-pass filtered acceleration signal.

In a method step S7, the user's movement is additionally monitored on the basis of the high-pass filtered acceleration signal and the low-pass filtered acceleration signal.

In a method step S8, a data analysis of the proximity sensor signal is performed.

In method step S9, it is ascertained whether an earphone is being inserted into an ear of a user. In this step, an approaching movement is identified on the basis of the time profile of the proximity sensor signal, and it is determined whether this is a movement of the earphone to an ear of the user. This hypothesis is confirmed or rejected using the low-pass filtered acceleration signal and the high-pass filtered acceleration signal. For this purpose, in particular an end time of the approaching movement is ascertained.

In a method step S10, an operating mode of the earphone, i.e. an out-of-ear operating mode or an in-ear operating mode, is selected on the basis of the decision.

What is claimed is:

1. An earphone, comprising:
 a proximity sensor configured to generate a proximity sensor signal;
 an acceleration sensor configured to generate an acceleration sensor signal; and
 a signal analysis device configured to:
  a. identify an approaching movement of the earphone to an object using the proximity sensor signal;
  b. ascertain whether the approaching movement is a movement of the earphone to an ear of the user, with fluctuations in a time profile of the proximity sensor signal being analyzed and taken into consideration;
  c. generate a high-pass filtered acceleration signal and a low-pass filtered acceleration signal by filtering the acceleration sensor signal;
  d. ascertain an end time of the approaching movement based on a stabilization of the acceleration, using the low-pass filtered acceleration signal; and
  e. confirm that the approaching movement is a movement of the earphone to an ear of the user based on changes in the high-pass filtered acceleration signal after the ascertained end time of the approaching movement.

2. The earphone as recited in claim 1, wherein the signal analysis device is configured to ascertain and take into consideration a monotonicity of the time profile of the proximity sensor signal in order to analyze the fluctuations in the profile of the proximity sensor signal of the proximity sensor.

3. The earphone as recited in claim 1, wherein the signal analysis device is configured to confirm that the approaching movement is a movement of the earphone to an ear of the user based on a measure of the changes in the high-pass filtered acceleration signal after the ascertained end time of the approaching movement exceeding a first predefined threshold value.

4. The earphone as recited in claim 3, wherein the signal analysis device (4) is designed to identify that the approaching movement is not a movement of the earphone (1) to an ear of the user if the measure of the changes in the high-pass filtered acceleration signal after the ascertained end time of the approaching movement is below a second predefined threshold value.

5. The earphone as recited in claim 1, wherein the signal analysis device is configured to ascertain, based on the proximity sensor signal, whether the earphone is being removed from the user's ear.

6. The earphone as recited in claim 1, wherein the signal analysis device is configured to identify an absence of movement based on the acceleration sensor signal, and to set the earphone to an out-of-ear operating mode when the absence of the movement is identified.

7. The earphone as recited in claim 1, wherein the signal analysis device is configured to identify, based on the acceleration sensor signal, a movement of the earphone which, because of an intensity of the acceleration sensor signal, cannot be generated by head movements, and to set the earphone to an out-of-ear operating mode when the movement of the earphone not being generated by the head movements is identified.

8. The earphone as recited in claim 1, wherein the acceleration sensor is a triaxial acceleration sensor.

9. The earphone as recited in claim 8, wherein the signal analysis device is configured to calculate maxima and minima of accelerations along the three axes and to take the calculated maxima and minima into consideration when confirming that the approaching movement is a movement of the earphone to an ear of the user.

10. A method for identifying whether an earphone is being inserted into an ear of a user, comprising the following steps:
 identifying an approaching movement of the earphone to an object using a proximity sensor signal of a proximity sensor of the earphone;
 ascertaining whether the approaching movement is a movement of the earphone to an ear of the user, with fluctuations in a time profile of the proximity sensor signal being analyzed and taken into consideration;
 filtering an acceleration sensor signal of an acceleration sensor of the earphone to generate a high-pass filtered acceleration signal and a low-pass filtered acceleration signal;
 ascertaining an end time of the approaching movement based on a stabilization of the acceleration, using the low-pass filtered acceleration signal; and
 confirming that the approaching movement is a movement of the earphone to an ear of the user based on changes in the high-pass filtered acceleration signal after the ascertained end time of the approaching movement.

* * * * *